United States Patent [19]

Mounger

[11] Patent Number: 5,025,177

[45] Date of Patent: Jun. 18, 1991

[54] SENSITIVE LOW POWER COMPARATOR

[75] Inventor: Robert W. Mounger, Dallas, Tex.

[73] Assignee: Dallas Semiconductor Corporation, Dallas, Tex.

[21] Appl. No.: 387,471

[22] Filed: Jul. 28, 1989

[51] Int. Cl.⁵ ............................................. H03K 5/24
[52] U.S. Cl. .................................. 307/355; 307/491; 307/497
[58] Field of Search ............... 307/355, 350, 362, 491, 307/494, 497

[56] References Cited

U.S. PATENT DOCUMENTS

3,957,708  5/1976  Musa ................................. 307/355
4,658,157  4/1987  McGowan ....................... 307/355

*Primary Examiner*—John Zazworsky
*Attorney, Agent, or Firm*—Worsham, Forsythe, Sampels & Wooldridge

[57] ABSTRACT

An integrated circuit which uses an unusual comparator design, which is not fully complementary but which has an extended common mode range, to control switching of one pole of the output driver (e.g. the lower pole) between an internal voltage (e.g. ground voltage) and a current extracted from an incoming signal.

6 Claims, 4 Drawing Sheets

IMPROVED COMMON MODE RANGE

FIG. 5b

STANDARD

FIG. 5c
(PRIOR ART)

SENSITIVE LOW POWER COMPARATOR

PARTIAL WAIVER OF COPYRIGHT

All of the material in this patent application is subject to copyright protection under the copyright laws of the United States and of other countries. As of the first effective filing date of the present application, this material is protected as unpublished material. Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The following applications of common assignee contain related subject matter, and are believed to have effective filing dates identical with that of the present application:

Ser. No. 07/387,467, filed 07/28/89, entitled "ESD CIRCUIT FOR INPUT WHICH EXCEEDS POWER SUPPLIES IN NORMAL OPERATION";

Ser. No. 07/387,462, filed 07/28/89, entitled "ZERO POWER COMPARATOR";

Ser. No. 07/387,546, filed 07/28/89, entitled "POWER DOWN CIRCUITY FOR LOW-POWER CIRCUIT WITH DUAL SUPPLY VOLTAGES";

Ser. No. 07/386,823, filed 07/28/89, entitled "LOW-POWER COMPARATOR WHICH TOLERATES HIGH-SLEW-RATE INCOMING SIGNALS";

and Ser. No. 07/386,098, filed 07/28/89, entitled "INTEGRATED CIRCUIT WITH HIGH-IMPEDANCE WELL TIE"; all of which are hereby incorporated by reference.

BACKGROUND AND SUMMARY OF THE INVENTION

The present invention relates to low-power integrated circuits, and particularly to integrated circuits which can provide data communication over a serial channel.

Battery-powered and portable electronic modules and system have found an increasing variety of applications. In general, such a system or module can provide advantages which may include portability; improved immunity to extraneous electrical noise; persistent memory; improved safety; lighter weight; improved capability for international marketing; and simplified regulatory requirements. Thus, more and more functions have been added into battery-powered systems, particularly for systems which have very low current requirements (and can therefore use small, long-lifetime batteries, such as lithium batteries).

However, one function which is not easy to achieve in such a low-power system is serial data communications. The conventional protocols for serial data communications, if implemented in a straightforward fashion, could rapidly exhaust a battery.

For example, the RS232 standard is very widely used, in microcomputer and minicomputer (and other) systems. RS232 has a number of advantages: it is widely used; the connections are simple (requiring only RX, TX, and ground); and (as actually interpreted by users) the standards are understood to be somewhat flexible, so that adaptation to changing technology is readily possible.

However, the RS232 standard specifies a 3 to 7K ohm load resistor to ground, and normally the RS232 data line will remain in the negative (mark) level when the line is idle. Since this level is below ground voltage, a significant current normally flows in the idle state. (In a battery-powered module, the positive and negative supply voltages could be taken from separate batteries, or a charge-pumping circuit could be used to obtain two supply voltage polarities from a single battery; but in either case the current requirements will still reduce the battery lifetime.) Thus, a substantial current must be sourced whenever a negative level occurs on the incoming line. If a user were to initiate a data communication session, and then leave the interface active when interrupted, this current requirement could rapidly deplete a battery.

The disclosed innovations provide a solution to this problem. The battery-powered module of the presently preferred embodiment steals current from one of the data lines to power the other data line. When the battery-powered module is transmitting a high level, battery current will be used; but, since the low level is (in practice) the default state, high levels occur relatively infrequently, and power consumption due to the high levels will be small.

Among the innovations disclosed in the present application is an integrated circuit which uses an unusual comparator design, which is not fully complementary but which has an extended common mode range, to control switching of one pole of the output driver (e.g. the lower pole) between an internal voltage (e.g. ground voltage) and a current extracted from an incoming signal.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment, wherein these innovative teachings are advantageously applied to the particular problems of an RS232 interface. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

SAMPLE SYSTEM CONTEXT

An example of a system wherein the integrated circuit of the presently preferred embodiment can be used will now be described. This system example is certainly not the only kind of system in which the disclosed innovative integrated circuit can be used, but it will help to illustrate the advantages of the disclosed innovations.

Figure 6:
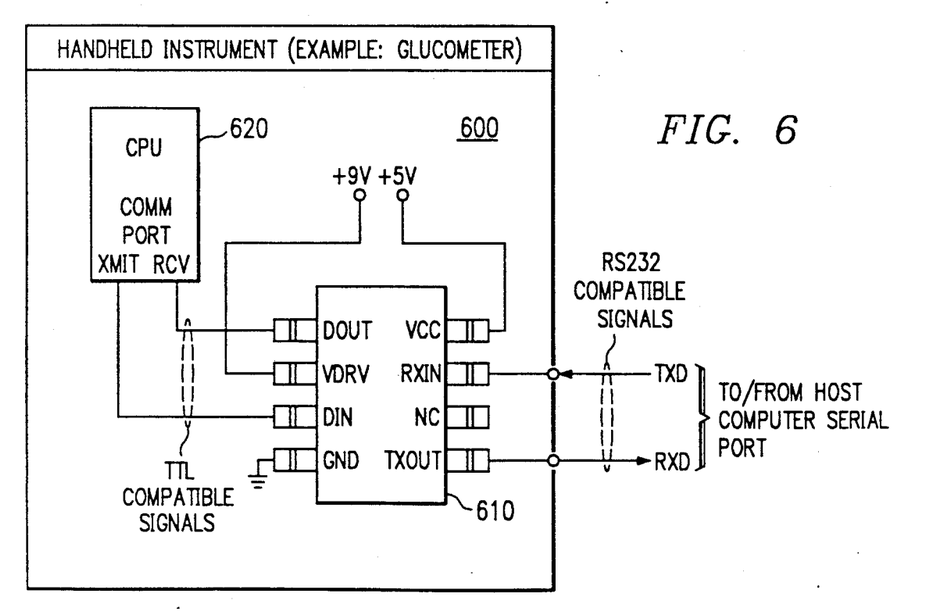
FIG. 6 shows a sample system configuration using the integrated circuit of the presently preferred embodiment.

FIG. 6 shows a sample system configuration using the integrated circuit of the presently preferred embodiment. In this example, a handheld instrument 600 (e.g. a wireless transceiver, a pH-meter, or a glucometer) includes (as is common) a microprocessor 620 (e.g. a DS5000, or any other of the many microprocessors and microcomputers which are commonly used for such applications). The microprocessor 620 provides TTL-level data signals at a pair of data ports XMIT and RCV. These ports are directly connected to the TTL interface pins DIN and DOUT of an RS232 interface chip 610 as described below. The RS232 chip 610 receives (in this example) power supply voltages of +5 and +9 Volts, and is also connected to ground. The RS232 chip performs line-driver driver and line-receiver functions for interfacing to a standard RS232 line. Thus, the handheld module 600 can easily interface to a host computer, or to any other device which can use standard communication protocols.

The two power supplies $V_{CC}$ and $V_{DRV}$ can be supplied in several ways. For example, both could be connected to a common 3 Volt lithium battery supply, or to separate small batteries at different voltages. (For example, if full RS232 levels are needed, a 3 V Lithium battery might be used to supply $V_{CC}$, and a 9 V transistor battery used to supply $V_{DRV}$. However, in the presently preferred embodiment $V_{CC}$ is set at 5 V.) Alternatively, a battery supply may be connected directly to supply $V_{CC}$, and through a voltage-boosting circuit to supply $V_{DRV}$ at a higher voltage.

FULL- OR HALF-DUPLEX OPERATION

The presently preferred embodiment is most readily used in a system where half-duplex operation is possible, since the RX line provides a current sink which can be used to drive the TX line low. However, in fact, the preferred integrated circuit can also be used, interfacing to a PC-type computer, in full-duplex operation. In this case the varying levels on the RX line will cause the mark level on the TX line to be modulated. However, the RS232 interfaces commonly used have a mark/space discrimination threshold which is significantly above ground (typically in the neighborhood of 1.5 to 2 Volts). Thus, such a noisy mark signal will typically still be correctly recognized.

PREFERRED INTEGRATED CIRCUIT

The integrated circuit of the presently preferred embodiment will now be described in detail.

OVERALL CHIP ARCHITECTURE

Figure 1:
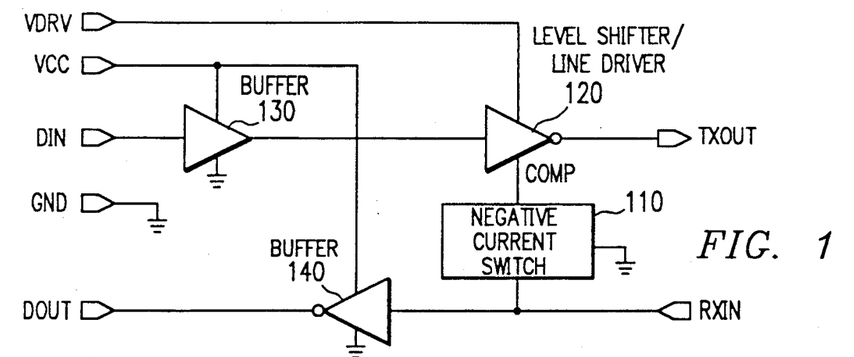
FIG. 1 is a high-level circuit diagram of the integrated of the presently preferred embodiment.

FIG. 1 is a high-level circuit diagram of the integrated circuit of the presently preferred embodiment.

In FIG. 1, buffer 130 amplifies digital data, and level-shifter/ line-driver circuitry 120 converts this to RS232 levels to drive the transmit line TXOUT. (Similarly, buffer 140 level-shifts an incoming RS232 signal (on line RXIN) to standard digital levels.) Note that the negative current supply is taken from negative current switch 110, which can sink current either to ground or to line RXIN (if that line is below ground).

The preferred chip embodiment is a CMOS device that provides a low-cost, very low-power interface to RS232 serial ports. The receiver input translates RS232 signal levels to common CMOS/TTL levels. The transmitter employs a unique circuit which steals current from the receive RS232 signal when that signal is in a negative state (marking). Since most serial communication ports remain in a negative state statically, using the receive signal for negative power greatly reduces the preferred chip embodiment's static power consumption. This feature is especially important for battery-powered systems such as laptop computers, remote sensors and portable medical instruments. During an actual communication session, the preferred chip embodiment's transmitter will use system power (5–12 Volts) for positive transitions while still employing the receive signal for negative transitions.

OPERATION

Designed for the unique requirements of battery-backed systems, the preferred chip embodiment provides a low-power interface to an RS232 serial port. Typically, a designer must use an RS232 device which uses his system power during both negative and positive transitions of the transmit signal to the RS232 port. If the connector to the RS232 port is left connected for an appreciable time after the communication session has ended, power will statically flow into that port, draining the battery-capacity. The preferred chip embodiment eliminates this static current drain by stealing current from the receive line (RXIN) of the RS232 port when that line is at a negative level (marking). Since most asynchronous communication over an RS232 connection typically remains in a marking state when data is not being sent, the preferred chip embodiment will not consume system power in this condition. System power would only be used when positive-going transitions are needed on the transmit RS232 output (TXOUT) when data is sent. However, since asynchronous communication sessions typically exhibit a very low duty-cycle, overall system power consumption remains low.

RECEIVER SECTION

The RXIN pin is the receive input for an RS232 signal whose levels can range from ±3 to ±15 Volts. A negative signal is called a mark while a positive signal is called a space. These signals are inverted and then level-shifted to normal +5 Volts CMOS/TTL logic levels. The logic output associated with RXIN is DOUT which swings from $+V_{CC}$ to ground. Therefore, a mark on RXIN produces a logic 1 at DOUT; a space produces a logic 0.

The input threshold of RXIN is typically around 1.8 Volts with 500 milliVolts of hysteresis to improve noise rejection. Therefore, an input positive-going signal must exceed 1.8 Volts to cause DOUT to switch states. A negative-going signal must now be lower than 1.3 Volts to cause DOUT to switch again. An open on RXIN is interpreted as a mark, producing a logic 1 at DOUT.

TRANSMITTER SECTION

DIN is the CMOS/TTL compatible input for digital data from the user system. A logic one at DIN produces a mark at TXOUT while a logic 0 produces a space. As mentioned earlier, the transmitter section employs a unique driver design that uses the RXIN line for swinging to negative levels (marking). The RXIN line must be in a marking or idle state to take advantage of this design; if RXIN is in a spacing state, TXOUT will only swing to ground. When TXOUT needs to transition to a positive level, it uses the $V_{DRV}$ power pin for this level. $V_{DRV}$ can be as high as $+12$ V nominal, or can be tied directly to the $+5$ volt $V_{CC}$ supply. However, in the presently preferred embodiment, $V_{DRV}$ must be greater than or equal to $V_{CC}$ at all times.

The voltage range on $V_{DRV}$ permits the use of a 9 volt battery in order to provide a higher voltage level when TXOUT is in a space state. In the preferred chip embodiment, when $V_{CC}$ is shut off while $V_{DRV}$ is still active (as might happen in a battery-backed condition), no current will be drawn from $V_{DRV}$ if TXOUT is floating. If TXOUT is loaded during such a condition, $V_{DRV}$ will not draw current only if RXIN is in a negative state. During normal operation ($V_{CC}=5$ Volts), $V_{DRV}$ will draw about 1 microA when TXOUT is marking. Of course, when TXOUT is spacing $V_{DRV}$ will draw substantially more current (typically about 5-10 mA), depending upon its voltage and the impedance that TXOUT sees.

The TXOUT output is slew-rate limited to less than 30 Volts per microsecond, in accordance with RS232 specifications. In the event TXOUT should be inadvertently shorted to ground, internal current-limiting circuitry prevents damage, even if continuously shorted.

RS232 COMPATIBILITY

The intent of the preferred chip embodiment is not so much to meet all the requirements of the RS232 specification as to offer a low-power solution that will work with most RS232 ports with a connector length of less than 10 feet. As a prime example, the preferred chip embodiment, if powered by $V_{DRV}=+5$ Volts, will not meet the RS232 requirement that the signal levels be at least $\pm 5$ Volts when terminated by a 3 Kohm load. In this case, in the presently preferred embodiment, a voltage of 4 Volts will typically be present at TXOUT when spacing.

In the presently preferred embodiment, the data input RXIN is able to tolerate plus or minus fifteen Volts, and the low value of TXOUT will be a function of whatever RXIN is (if RXIN is in the mark state). (TXOUT can be operated between $V_{DRV}$ and ground if RXIN is high.) Most RS232 transceivers have a trip point (on their receive side) that is somewhat above ground, e.g. about 1.5 Volts. Thus, where such an interface is available, a system according to the present invention can operate full-duplex at any given time. However, in any case, a system according to the present invention can operate half-duplex with full RS232 levels.

PREFERRED SPECIFIC CIRCUIT IMPLEMENTATION

The integrated circuit of the present preferred embodiment includes only 56 transistors. This integrated circuit provides a bidirectional buffer and line interface, to interface between TTL and RS232 in both directions. This chip also uses the power from the RS232 line coming into the part (the receive line, or RXIN) to power the transmit line going out (the TXOUT line).

When the RXIN input is in a marking (negative voltage) state, a comparator network takes the negative power supply for the transmitted signal TXOUT from the receive line RXIN. This output is then allowed to toggle between $V_{DRV}$ and (approximately) RXIN. $V_{DRV}$ (the driver output supply) can be as low as $V_{CC}$ or as high as thirteen Volts. The lower voltage will be slightly increased over RXIN by the on-state resistance of a transistor.

In the presently preferred embodiment, the circuitry for the negative current switch uses no power except when actually switching. There are no bias currents running anywhere. A full threshold voltage $V_T$ of signal must be developed to make a gate flip, but once it flips it sets up and consumes no additional power.

Figure 3:
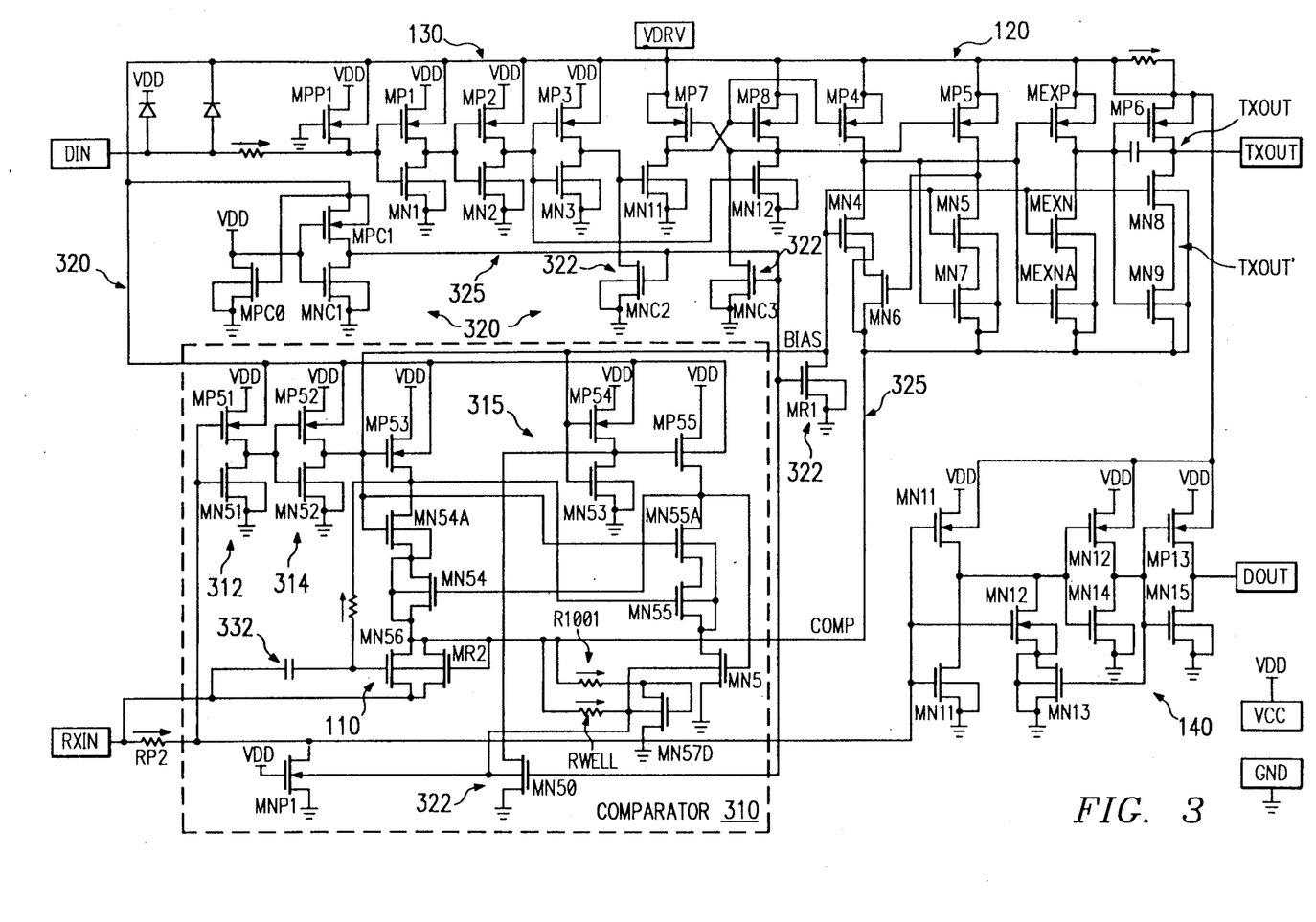
FIG. 3 is a detailed circuit diagram of the integrated circuit of the presently preferred embodiment.

FIG. 3 is a detailed circuit diagram of the integrated circuit of the presently preferred embodiment.

ZERO-POWER COMPARATOR

The comparator 310 in FIG. 3 selects which of the possible negative supplies (RXIN or ground) to use. This is accomplished with no bias current whatever.

The COMP node can be connected directly to the RXIN pad by large transistor MN56, or to ground by transistor MN57. The complementary outputs of comparator 310 select which of those two transistors is turned on.

An advantageous part of this comparator is the inverter stage 312. This inverter is extremely asymmetric. In the preferred embodiment, the NMOS device is 90 microns wide (but has minimum length, which is 1 1 microns in the presently preferred embodiment), and the PMOS device is 6 microns wide and 200 microns long. The very unequal drive capabilities of the NMOS and PMOS devices means that the inverter's trip point is very close to ground plus one N-channel threshold ($V_{SS}+V_{TN}$). Thus, when a rising edge appears on RXIN, the inverter 312 will switch states as soon as the incoming signal, propagated through resistor RP2, rises above $V_{SS}+V_{TN}$. Since $V_{TN}$ is nearly 1 Volt in the presently preferred embodiment, the comparator has low sensitivity. However, the outstanding advantage of this comparator (especially in a system as described) is its lack of standby power consumption.

The output of asymmetric inverter 312 is fed to another inverter stage 314, which has a more normal trip point (close to $V_{DD}/2$). (Inverter 314, in the presently preferred embodiment, has a P-channel width of 20 microns, and an N-channel width of 6 microns.) The output of inverter 314 drives a modified level-shifter stage 316.

The P-channel transistors MP53 and MP55 provide the inputs of circuit 316. (The output of inverter 314 is connected directly to transistor MP53, and an additional inverter stage 315 provides an inverted signal to drive transistor MP55.) In circuit 316, transistors MN54A and MN55A limit the $V_{DS}$ drop on transistors MN54 and MN55 respectively. The P-channel transistors MP53 and MP55 are cross-coupled down to NMOS transistors MN54 and MN55, whose sources are at COMP. The complementary outputs of this level-shifting configuration drive transistors MN56 and MN57, which switch COMP between RXIN and ground.

TTL-TO-RS232 BUFFER

Circuit area 130 is a TTL buffer, which receives TTL levels from pad DIN, and uses three inversions to shift the levels up to full CMOS. Circuit area 130 provides a TTL-to-RS232 buffer. This provides a level shift to $V_{DRV}$ on the high side and COMP on the low side.

$V_{DS}$-LIMITING TO AVOID PUNCHTHROUGH

The pairs of N-channel transistors MN4/MN6, MN7/MN5, MEXN/MEXNA, and MN8/MN9 are put in series to limit the source-drain voltage drop $V_{DS}$ across any one of them. When both transistors of a pair are turned off, and TXOUT is high and RXIN is low, there may be 30 Volts or more of total voltage drop. The BIAS signal controls one transistor of each pair. This ensures that the total voltage drop is actually divided. By ensuring that this drop will be divided across these two devices, punchthrough is avoided. In the process of the presently preferred embodiment, the PMOS devices have much higher $V_{DS}$ maxima, so such protection is not used except for the NMOS devices.

The BIAS signal is kept at zero Volts when the COMP signal is at a very negative voltage, so that when transistor MN9 is off, node TXOUT is only allowed to go up as high as one $V_T$ below ground. This prevents the $V_{DS}$ across transistor MN8 from exceeding about 15 Volts minus one $V_T$.

When the COMP node is connected to ground, the BIAS node will be driven to $V_{DD}$ by the output of inverter 314. This ensures that, when the TXOUT node has gone very positive and the COMP node is connected to ground, transistors MN4, MN5, MEXN, and MN8 will not necessarily be turned off.

POWER-SWITCHING

The COMP node can be connected directly to the RXIN pad by large transistor MN56 (in parallel with smaller transistor MR2, connected as a MOS diode), or to ground by transistor MN57. Transistor MR2 provides a small current when MN56 is turned off. (When $V_{DD}$ has failed, this small current serves to hold line COMP at one threshold voltage over RXIN.) The complementary outputs of comparator 310 select which of those two transistors is turned on. Ohmic drop in transistor MN56 is undesirable, and this transistor is preferably quite large (450 microns wide, in the presently preferred embodiment).

RS232-TO-TTL BUFFER

Buffer 140 translate the RS232 levels to TTL levels. The signal received at pad RXIN is passed through resistor RP2, and then connected to the first stage of this buffer. Note that a feedback circuit is included to provide some hysteresis: Whenever RXIN has been high for a long time, transistor MN13 will be turned on, so that transistor MN12 is effectively placed in parallel with transistor MN11. Transistor MN12 is preferably much wider than either transistor MN11 or transistor MP11, and therefore the addition of transistor MN12 will significantly shift the trip point of the inverter formed by MN11 and MP11.

PROTECTION AGAINST FAILURE OF THE LOWER OF TWO SUPPLY VOLTAGES

The preferred embodiment has two power supplies: one ($V_{CC}$) is used to power the TTL input circuitry. That voltage is used to provide a good reference point for TTL levels. In the presently preferred embodiment, this voltage is five Volts (plus or minus ten percent). The other supply voltage ($V_{DRV}$) provides the voltage needed to drive RS232 levels. Depending on how the system designer chooses to provide power supplies, voltage $V_{DRV}$ may be equal to $V_{CC}$ (to provide "pseudo-RS232" levels, which do not fully meet the RS232 standard but which will generally be recognized by RS232 receivers), or may be as high as 13 Volts (if full RS232 levels are required).

In some system configurations the $V_{DRV}$ and $V_{CC}$ voltages may be separately supplied (e.g. from separate batteries). In such cases, a potential problem has been discovered: if $V_{CC}$ was allowed to fall while $V_{DRV}$ remains high, excessive leakage current may be drawn from the high voltage supply $V_{DRV}$. To assure very low power consumption, the present invention provides a circuit 320 to clamp certain key nodes in this case, and thereby avoid floating nodes and leakage. If the $V_{CC}$ supply fails, in the presently preferred embodiment, while $V_{DRV}$ remains high, then long narrow NMOS transistor MPC0 will leak $V_{DD}$ down to ground. This low level will flip the inverter 324 (formed by transistors MNC1 and MPC1), which drives line 325 high. Line 325 is connected to several NMOS transistors 322, which clamp various key nodes inside the circuit down to ground. Thus, there are no floating nodes which could reach intermediate voltage levels and cause power to be drawn from $V_{DRV}$.

This capability can aslo be used for applications where the lower power supply can be switched on and off. Avoiding leakage can be useful for this reason too.

SEPARATE TRANSIENT PROTECTION FOR LOGIC CIRCUITS

As noted above, RXIN connects directly to MN56 and MR2 without a limiting resistor. Since the output driver has to drive a load of only 3 Kohm (under the RS232 specification), series resistance in the power supply line COMP must be minimized. This makes input protection of the RXIN pad difficult: it would be safer to have some limiting resistor in series with this pad.

To provide some input protection, in the presently preferred embodiment, two separate current paths are brought in from the RXIN pad. One path goes directly to the power switching devices MN56 and MR2, as mentioned. The other path is routed, through series resistance RP2, to any other gates which need to see the RXIN signal. This series resistance provides a certain time constant on this path, which protects the other gates.

In addition, capacitor 332 provides some protection for the gate of transistor MN56. This provides additional capacitive loading in parallel with the gate of this transistor, so that fast incoming transients will need more energy to develop a large gate-to-source voltage on MN56.

Resistor RP2, in the presently preferred embodiment, is implemented as an N+ resistor in a P− floating well, so that any portion of this resistor can go above and below both supplies without forward biasing any junctions. The value of this resistor, in the presently preferred embodiment, is fifteen Kilohms, but of course other values could be used.

In an alternative embodiment, another series resistor is also used, as discussed below with reference to FIG. 4.

PROTECTION AGAINST HIGH-SLEW-RATE INPUTS

As noted, the comparator 310 does not trip until it receives a full $V_T$ of differential. The threshold voltage $V_T$, in the presently preferred embodiment, may be in the neighborhood of one Volt. This means that RXIN could have gotten up to 1 Volt, and COMP could have gotten up to 1 Volt, before transistor MN57 turns on and brings COMP down to ground. This would be risky, since the ground line would have risen by more than a diode drop, and this is likely to turn on various parasitic bipolar devices and diodes in many places.

A further potential problem exists with high-slew-rate signals. Suppose that RXIN is at a negative voltage, and therefore MN56 is on and RXIN is connected to the COMP node. The potential problem is that, if the RXIN node rises very fast, the COMP node may have come all the way up to $V_{CC}$ by the time inverters 312 and 314 change their state. However, once the node has been pulled up to $V_{CC}$, there is no longer any way to switch it, since there is (in effect) no longer any power supply voltage present.

Additional innovative teachings herein help to provide the capability to face such high-slew-rate signals. The potential problems are prevented, in the presently preferred embodiment, by clamping the COMP node. However, this could not be done with a normal clamp diode structure.

Normally, to clamp a node from going above ground, the node could be connected to a P well in which and N+ diffusion is grounded. However, the N- substrate is at $V_{DRV}$, so it may be seen that this creates a parasitic bipolar transistor, with the collector at $V_{DRV}$, the base is the clamp point, and the emitter is grounded. So if you need a milliAmp to clamp, this may cause a current drain of one hundred milliAmperes coming out of $V_{DRV}$. It is not power-efficient to clamp with the base of a transistor.

The COMP node is clamped, in the presently preferred embodiment, by MOS diode MN57D. Note that a resistance R1001 is explicitly shown in series with diode MN57D, but in fact that is merely a representation of the parasitic resistance in this circuit path.

HIGH-IMPEDANCE WELL TIE

If the well with MN57D were tied to ground, then when COMP goes negative the well would be much higher than COMP. Since COMP is supposedly the most negative potential, one might consider tieing the well to COMP instead. However, in this case a problem can arise when an incoming transient appears. Thus, if the well is tied to ground, a DC condition may exist (when COMP is negative) where the well is forward biased; and if the well is tied to COMP, it would be susceptible to a transient condition.

According to this class of embodiments, the well is tied to COMP, but with a resistor interposed. This resistor is in series with the base of the undesirable parasitic bipolar device in the clamping structure, as discussed above, and therefore lowers the gain of this bipolar. In the transient case, this limits the current into the base, and allows the MOSFET to be the clamp. The well tie, in the presently preferred embodiment, is shown with clamping MOS diode MN57D, and the well tie resistor RWELL, in the presently preferred embodiment, has a value of 35K ohm.

This well tie structure is particularly advantageous in circumstances, such as in the presently preferred embodiment, where the substrate junction diodes may be forward biased for a large fraction of the time, so that strong latch-up protection is needed.

In the circuit diagram of FIG. 3, it may be seen that the series resistor RWELL is used to set the well potential for transistors MN57D, MN57, MN58, and MNP1.

PHYSICAL IMPLEMENTATION OF WELL TIE

Figure 2A:
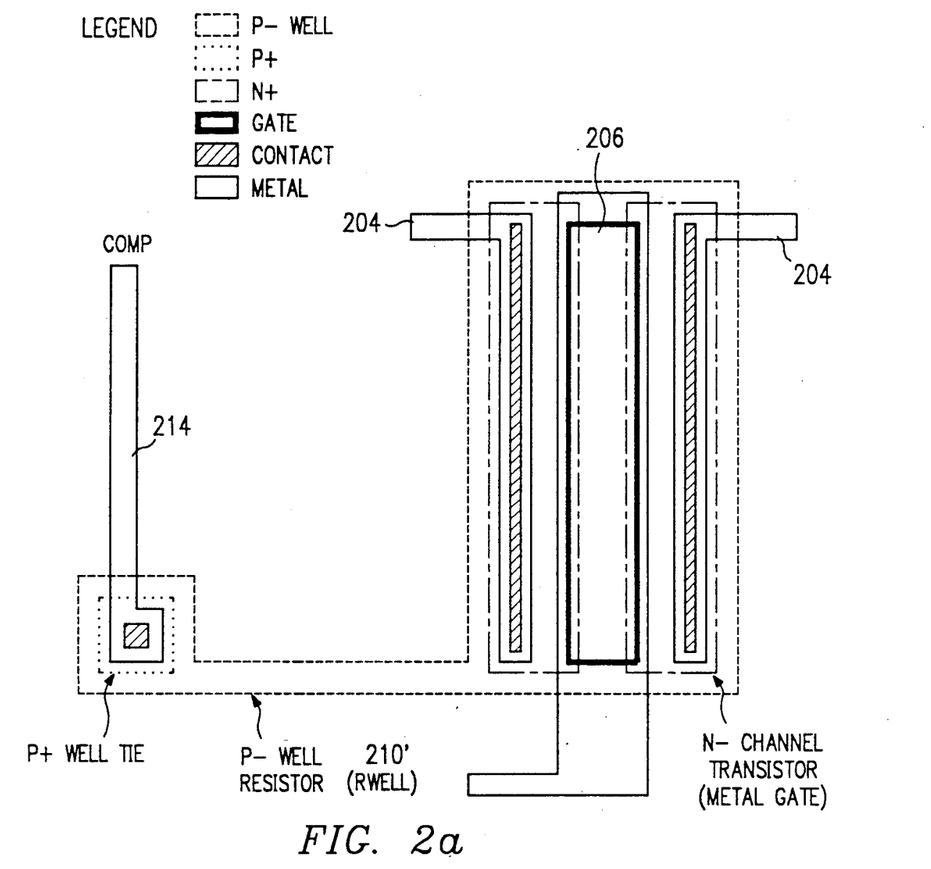
FIG. 2 shows the device structure preferably used to provide a high-impedance well tie, in the integrated circuit of the presently preferred embodiment.
Figure 2B:
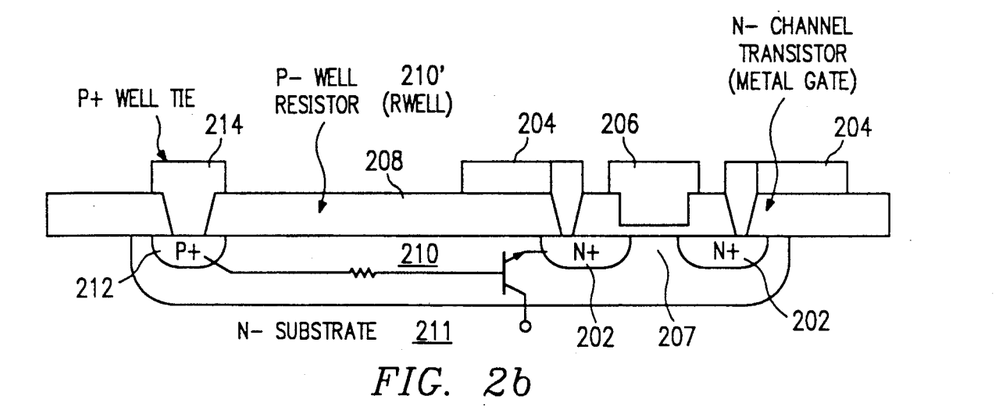

FIG. 2 shows the device structure preferably used to provide a high-impedance well tie, in the integrated circuit of the presently preferred embodiment.

FIG. 2 shows aligned plan and section views. At the right side of the figure is a transistor, including first and second source/drain regions 202. The source/drain regions 202 are located in a P-well 210, which is a P-type diffusion in the N-type substrate 211. A gate 206, overlying a thinner portion of the oxide 208, is capacitively coupled to a portion 207 of the P-well 220 between the source/drain regions 202. (Thus, when a sufficiently positive voltage is applied to gate 206, the portion 207 of the P-well 210 immediately below the gate 206 will be inverted, so that the transistor is turned on.)

The P-well 210 also includes a narrow extended portion 210', which is not strictly needed for operation of the transistor, but which provides a series resistance RWELL between a P+ diffusion 212 and the transistor's channel region 207. The P+ diffusion 212 is contacted by a metal line 214, which (in this example) carries the COMP signal.

Of course, multiple transistors can be (and preferably are) located in a common P-well. In addition, additional contacts and interconnects can be used to share a single resistor 210' among multiple wells.

PREFERRED PROCESS FLOW

The presently preferred embodiment has actually been implemented in a metal-gate CMOS process. Although the innovative teachings set forth herein can, in general, be adapted to a more standard CMOS process (using polysilicon or polycide gates), the metal-gate process has been found to be suitable, and will therefore be described. (Any process which is used should preferably able to withstand the high voltages used in the RS232 interface, and the metal-gate process does have sufficiently high breakdown voltages). It must be understood, however, that this process is being described only to provide a clear picture of the invention as presently practiced, and that most or all of the disclosed innovative teachings can be implemented without this specific process. The metal gate CMOS process dates back to the 1970s, and differs in several respects from the polysilicon-gate processes which are now more common.

This process has a typical gate oxide thickness of 1200 Angstroms, and a minimum drawn channel length of 11 microns. (The effective channel length $L_{eff}$, for this minimum drawn geometry, will be about 6.5 microns.) The P-channel threshold voltage ($V_{TP}$) and the N-channel threshold voltage ($V_{TN}$) are both typically 1.2

Volts. The P-well is doped to a (typical) sheet resistance of about 3000 ohms per square. The n+ source/drain diffusions have a typical junction depth of 2.3 microns, and are doped to a sheet resistance which is typically about 15 ohms per square. The p+ source/drain diffusions have a typical junction depth of 2.5 microns, and are doped to a sheet resistance which is typically about 70 ohms per square. The field threshold voltages (to turn on parasitic conduction under the thick field oxide) are only about ±7.5 V. The gate oxide will withstand at least 60 Volts.

For contact formation, an oxide etch is performed to remove the field oxide from all gate and contact locations. A regrowth step grows back about 1000 Angstroms of silicon dioxide, and then the contact locations (but not the gate locations) are exposed to a further etch which removes the gate oxide from these locations. The mask for this etch preferably uses an oversized contact mask. Thus, it takes two shapes to make a contact gate plus oversize contacts.

This process provides P-channel and N-channel devices which will both withstand at least 20 Volts between source and drain, at 0 Volts applied gate voltage, before breaking down. In fact, the P-channel transistors can typically withstand 35 to 40 Volts VDS; but the N-channels are good for about 20–25 V.

Another distinctive feature of this process is that the thick field thresholds are relatively low; thus all active areas which include circuits are necessarily guard-ringed.

PACKAGING OF THE PRESENTLY PREFERRED EMBODIMENT

The disclosed functionality can be implemented in a very small integrated circuit, with a very low pin count.

For example, in the presently preferred embodiment, an 8-pin SOIC is actually used. This example gives some idea of the compactness permissible, although, of course, other packages could be used instead.

In addition, it should be noted that it is not at all necessary to implement these functions on a separate integrated circuit, as in the presently preferred embodiment. In fact, in view of the small number of transistors and the small number of external pins required, it may even be particularly advantageous to use the circuitry of this embodiment as a design module, which designers can readily incorporate into the design of a more complex integrated circuit.

ALTERNATIVE EMBODIMENT WITH HIGHER-SENSITIVITY COMPARATOR

Figure 5A:
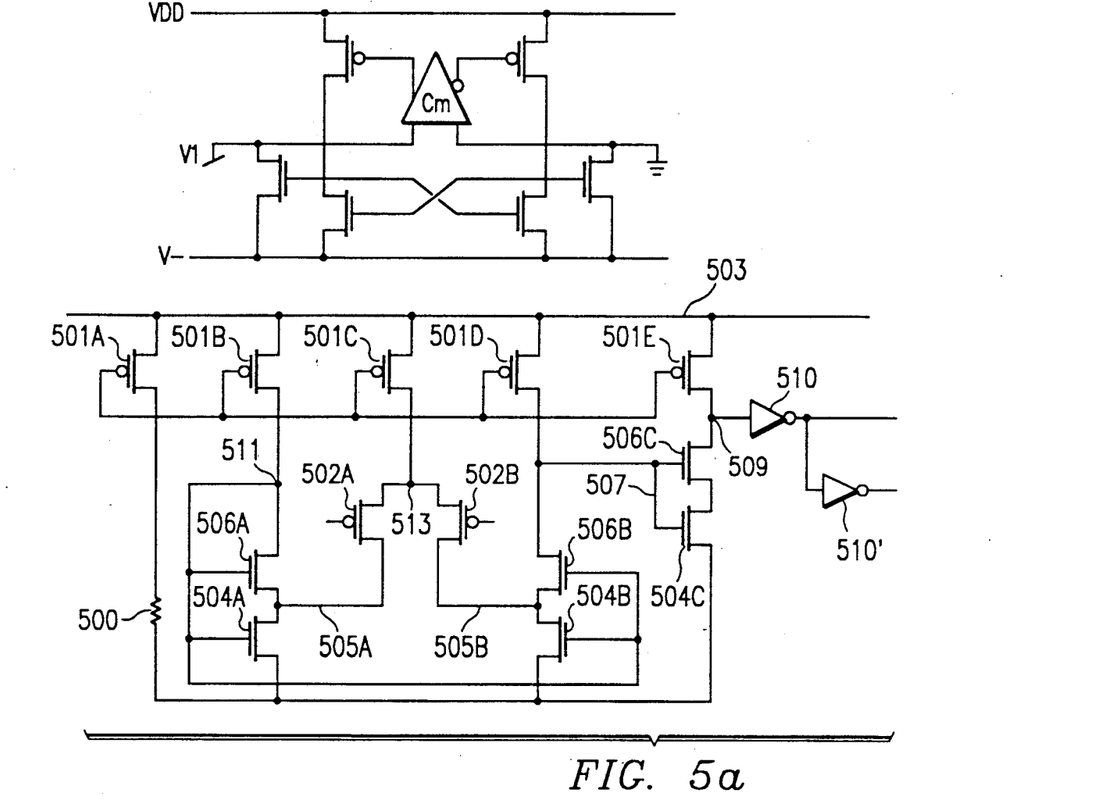
FIG. 5A shows a further alternative embodiment with a more sensitive comparator circuit, which still provides low power consumption (although not zero power consumption). To better explain this embodiment.

FIG. 5A shows a further alternative embodiment with a more sensitive comparator circuit, which still provides low power consumption (although not zero power consumption).

Note that this embodiment uses a full analog comparator, in place of the asymmetric gate 312. This comparator does draw some current, but provides a sensitivity of a few milliVolts of differential, and can operate with a trip point below ground. This may be preferable in applications where this high sensitivity may be required.

By contrast, in the presently preferred embodiment, the RS232 signal's differential is guaranteed to be at least plus or minus 3 Volts, and such a signal will exceed the trip point of a normal logic gate. Thus, the use of a digital gate at the input was possible, and has the advantages of less power consumption, less complexity, and reduced chip area.

The analog comparator of this embodiment provides more headroom than a typical CMOS comparator. In normal CMOS comparators, the dynamic range is limited to approximately the range from $(V_{SS}+V_{TN})$ to $(V_{DD}-V_{TP})$. The analog comparator of this embodiment differs from a normal CMOS comparator in several respects, and can tolerate input voltages which exceed $(V_{DD}-V_{TP})$.

Figure 5B:
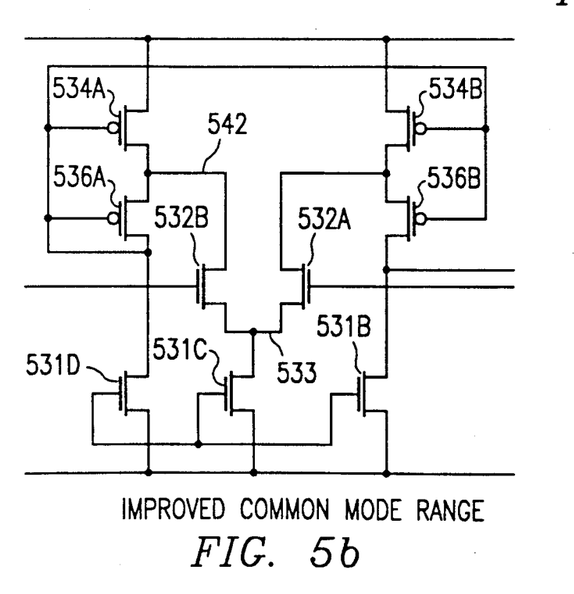
FIG. 5B shows a simplified version of the novel compararator of FIG. 5A (which has been modified for easier comparison with FIG. 5C).
Figure 5C:
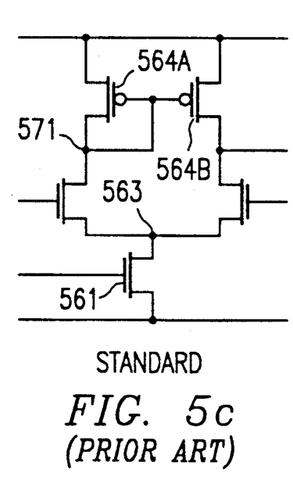
FIG. 5C shows a prior art comparator.

To better explain this embodiment, FIG. 5C shows a prior art comparator, and FIG. 5B shows a simplified version of the disclosed novel comparator. (The comparator of FIG. 5B is a simplified P/N dual of that of FIG. 5A, i.e. PMOS devices have been interchanged with NMOS devices, and power supply polarities have been reversed.)

To assess common mode behavior of these comparators, imagine that the two inputs are tied together, and consider how the circuit behaves as these inputs are driven to higher or lower voltages. In the circuit of FIG. 5C, transistor 561 is driven to provide a single current sink. As the common input voltage is brought up toward the supply voltage $V_{DD}$, the voltage $V_{FLOAT}$ of node 571 will approach the voltage $V_{MIRROW}$ of node 571, and will be clamped there. If the common input voltage exceeds VDD, then the P-channel devices will be turned off. Thus, normal operation will occur only as long as the drains of devices 564 (i.e. nodes 571 and $V_{OUT}$) do not exceed about $V_{DD}-V_{TP}$.

By contrast, in the comparator of FIG. 5B, transistors 531B, 531C, and 531D provide three separate current sinks. Transistor 536A will still be on when the common input voltage goes above $V_{DD}$, so that transistors 534A, 534B, and 536B can also remain on. Thus, normal operation can still occur even when the drains of devices 534 have exceeded $V_{DD}-V_{TP}$, up to at least about $V_{DD}$.

Thus, in the example of FIG. 5B, the positive supply voltage falls within the common mode range. (In the dual version of FIG. 5C, the ground voltage falls within the common mode range). This is a significant expansion in common mode range. For example, with $V_{DD}=5$ V and $V_{TP}=1$ V, this innovation increases the common mode range by at least 20%.

In the embodiment of FIG. 5A, a resistor 500 defines a current $I_{501A}$. This current is mirrored from PMOS transistor 501A onto PMOS transistors 501B, 501C, 501D, and 501E, to define controlled currents $I_{501B}$, $I_{501C}$, $I_{501D}$, and $I_{501E}$. Preferably transistors 501A, 501B, 501D, and 501E all have nominal dimensions of 250/5 (250 microns wide and 5 microns long), and transistor 501C is 500/5. Thus $I_{501A}=I_{501B}=0.5(I_{501C})=I_{501D}=I_{501E}$. (The value of resistor 500 is chosen so that transistors 501B, 501C, 501D, and 501E are the limiting impedances in their respective branches, so that the currents $I_{501B}$, $I_{501C}$, $I_{501D}$, and $I_{501E}$ can all be treated as constant.)

The two input signals are connected to the gates of PMOS transistors 502A and 502B respectively. Preferably the transistors 502A-B have dimensions of 5/5. The differential conductances of these two transistors (governed by their different gate voltages) divide the current $I_{501C}$, which is sourced to node 503. Thus, transistor 504A passes current $$I_{504A}=I_{501B}+mI_{501C},$$

and transistor 504B passes current $$I_{504B} = I_{501D} + (1-m)I_{501C}.$$

Tranistors 504A, 504B, 506A, and 506B are connected together in what is almost (but not quite) a current mirror arrangement. The drain of 506A (labelled as node 511) is connected to its gate, and also to the gates of transistors 504A, 504B, and 506B. The operation of this circuit may be most easily understood by comparison with the conventional circuit of FIG. 5C. If the circuit of FIG. 5A were modified by reconnecting nodes 505A and 505B, so that transistors 504A and 506A would then be approximately equivalent to a single longer transistor 504A/506A, and transistors 504B and 506B would then be approximately equivalent to a single longer transistor 504B/506B whose conductivity was modulated by variations in the current through device 504A/506A, the circuit would then be more analogous to the circuit of FIG. 5, where the conductivity of device 564A is mirrored onto device 564B. However, in FIG. 5A, a transistor 506A (driven by a respective current source) is interposed between node 505A (driven by transistor 502A of the differential input pair) and the node 511 from which the mirrored control voltage is taken. This provides substantial advantages.

The conductivity of devices 504B and 506B is modulated by the mirrored voltage of node 511. The voltage of node 507 will be determined by voltage division between device 501D and devices 504B and 506B. In turn, the voltage at the drain of 506B will be affected not only by the conductivity modulation caused by the voltage on 511, but also by the voltage change caused by the variable current component $(1-m)I_{501C}$ passing through transistor 504B.

The voltage of node 507 drives an analog amplification stage, which includes NMOS transistors 504C and 506C connected in series with the drain of PMOS transistor 501E. The resulting analog output voltage 509 is fed to a digital output gate 510 (which is followed by digital gate 510', to provide complementary digital outputs).

Preferably all three transistors 504A-C have matched dimensions. Preferably all three transistors 506A-C also have matched dimensions (which need not be equal to the dimensions of the transistors 504A-C). In the presently preferred version of this embodiment, all of the NMOS transistors 502A-B, 504A-C, and 506A-C have the same nominal dimensions (15/5). (The NMOS devices in the digital output gates 510 are preferably 5/20, and the PMOS devices in the digital output gates 510 are preferably 5/10.)

In FIG. 5A, node 513 is the node between current source 510C and the sources of transistors 502A and 502B. Node 505A is the node connected to the drain of 504A, the source of 506A, and the drain of 502A. Node 505B is the node connected to the drain of 504B, the source of 506B, and the drain of 502B. Note that node 513 can be pulled all the way down to ground.

There is a very small $V_{DS}$ across devices 502A-C, so that node 513 can go essentially all the way down to ground, because 504A and 504B will still be ON because of the second pair of devices 506A and 506B. This helps to provide the broad common mode range of this comparator.

ALTERNATIVE EMBODIMENT WITH FURTHER IMPROVED INPUT CLAMPING

Figure 4:
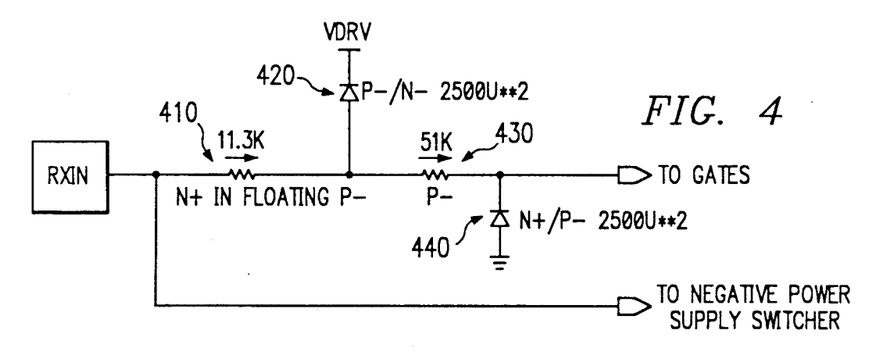
FIG. 4 shows an alternative embodiment with further improved input clamping.

FIG. 4 shows an alternative embodiment with further improved input clamping. In this embodiment, the input pad RXIN is again connected directly (without series protection) to the power-supply-switching devices. The input pad RXIN is also connected, through protection circuitry, to various logic gates. FIG. 4 shows the protection circuitry used, in this embodiment, to protect the logic gates against transient voltages.

The incoming signal is routed through resistor 410. In the presently preferred embodiment, this resistor is provided by an N+ diffusion in a floating p-well, and has a net resistance of about 11.3 kilohm. Next, diode 420 is provided (for example, by the P-/N- junction at the boundary of a p-well), to keep the line from going above the high supply voltage $V_{DRV}$. A further series resistor 430 provides additional loading of transient pulses. The resistor 430, in this embodiment, is configured from the P- diffusion, and has a resistance of 51 Kohms. Finally, another clamping diode 440 keeps the line voltage from going below ground. Diode 440, in the most preferred version of this embodiment, is a 2500 square micron junction from N+ to P-.

Now, suppose that a negative-going transient occurs at pad RXIN. The current drawn by such a transient will be limited by the sum of the resistances $R_{410}+R_{430}$. Thus, the current which must be sourced by diode 440 is further limited by this combined series resistance. This advantageously limits the amount of current taken from driving TXOUT and RXIN is below ground, without consuming a large area on the chip. A further advantage is current-limiting of the parasitic bipolar device.

Note that the use of two different types of resistors provides the largest possible economy of area, while minimizing susceptibility to transients. In particular, the use of the N+ diffusion, which has a lower sheet resistance, is used only where needed (before the diode clamp to $V_{DRV}$), and the higher-sheet-resistance P-well diffusion is used for the remainder of the series resistance.

By splitting up the series resistance in this fashion, some impedance is provided before the first hard diode, without causing an excessive total impedance. When a positive-going transient appears at the incoming signal, the current is limited only by a moderate impedance (which saves area); when a negative-going transient appears, the current is limited by a much higher impedance. This is advantageous since current sourcing is the direction which can cause battery drain.

The diode 420 helps to prevent charging the power supply, which is probably a battery (unless RXIN goes a diode drop above $V_{DRV}$). The N+/P- diode, when the P minus is at ground, can cause large current loss on clamping. Even a small clamping current through that diode tends to drain the upper power supply $V_{DRV}$, since a parasitic bipolar device can easily be turned on.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, an architecture like that described can be used for "power-robbing" with system protocols other than RS232.

As will be recognized by those skilled in the art, the innovative concepts described in the present application can be modified and varied over a tremendous range of applications, and accordingly their scope is not limited except by the allowed claims.

What is claimed is:

1. A MOS circuit, comprising:
    P-channel first and second transistors, respective gates of said first and second transistors being connected to respective ones of a differential pair of input signals;
    first, second, and third current sources,
        current from said first current source being sinked through an N-channel third and fourth transistors connected in series,
        current from said third current source being sinked through an N-channel fifth and sixth transistors connected in series,
        the sources of both said first and second transistors being commonly connected to jointly sink current from said second current source, the drain of said first transistor being connected to a node between said fourth and third transistors, and the drain of said second transistor being connected to a node between said sixth and fifth transistors, so that input signals can steer current from said second current source into either said third transistor or said fifth transistor;
        the drain of said fourth transistor being commonly connected to provide a gate voltage to said third, fourth, and sixth transistors,
        said fourth and sixth transistors having substantially identical widths and lengths, and said third and fifth transistors having substantially identical widths and lengths;
    and wherein the drain voltage of said sixth transistor is commonly connected to proivde an analog output voltage.

2. The MOS circuit of claim 1, wherein said first and third current sources match as nearly as possible.

3. The MOS circuit of claim 1, wherein said first and third current sources match as nearly as possible, and said second current source provides a current which is substantially larger than the current provided by said first current source.

4. A MOS circuit, comprising:
    P-channel first and second transistors, respective gates of said first and second transistors being connected to respective ones of a differential pair of input signals;
    first, second, third and fourth current sources,
        current from said first current source being sinked through an N-channel third and fourth transistors connected in series,
        current from said third current source being sinked through an N-channel fifth and sixth transistors connected in series,
        the sources of both said first and second transistors being commonly connected to jointly sink current from said second current source, the drain of said first transistor being connected to a node between said fourth and third transistors, and the drain of said second transistor being connected to a node between said sixth and fifth transistors, so that input signals can steer current from said second current source into either said third transistor or said fifth transistor;
        the drain of said fourth transistor being commonly connected to provide a gate voltage to said third, fourth, fifth, and sixth transistors,
        current from said fourth current source being sinked through an N-channel seventh and eighth transistors connected in series,
        said fourth, sixth, and eighth transistors all having substantially identical widths and lengths, and said third, fifth, and seventh transistors all having substantially identical widths and lengths;
    and wherein the drain voltage of said sixth transistor is commonly connected to provide a gate voltage to said seventh and eighth transistors, and the node below said fourth current source is connected to provide an analog output voltage, and said analog output voltage is operatively connected to the input of a digital circuit.

5. The MOS circuit of claim 4, wherein said first, third, and fourth current sources match as nearly as possible.

6. The MOS circuit of claim 4, wherein said first, third, and fourth current sources match as nearly as possible, and said second current source provides a current which is substantially larger than the current provided by said first current source.

* * * * *